United States Patent [19]
Moysan, III et al.

[11] Patent Number: 5,648,179
[45] Date of Patent: *Jul. 15, 1997

[54] ARTICLE HAVING A DECORATIVE AND PROTECTIVE COATING SIMULATING BRASS

[75] Inventors: Stephen R. Moysan, III, Douglasville; Rolin W. Sugg, Reading, both of Pa.

[73] Assignee: Baldwin Hardware Corporation, Reading, Pa.

[*] Notice: The term of this patent shall not extend beyond the expiration date of Pat. No. 5,552,233.

[21] Appl. No.: 668,296

[22] Filed: Jun. 21, 1996

Related U.S. Application Data

[63] Continuation of Ser. No. 447,330, May 22, 1995, abandoned.

[51] Int. Cl.⁶ .................................................... B32B 15/04
[52] U.S. Cl. .......................... 428/627; 428/648; 428/660; 428/675; 428/680; 428/661
[58] Field of Search .............................. 428/621, 628, 428/647, 674, 627, 646, 680, 675, 660, 648

[56] References Cited

U.S. PATENT DOCUMENTS

| | | | |
|---|---|---|---|
| 2,316,303 | 4/1943 | Wesley et al. | 204/49 |
| 2,432,893 | 12/1947 | Holt et al. | 204/13 |
| 2,653,128 | 9/1953 | Brenner et al. | 204/43 |
| 2,926,124 | 2/1960 | Taylor et al. | 204/43 |
| 3,090,733 | 5/1963 | Brown | 204/40 |
| 3,771,972 | 11/1973 | Schaer et al. | 29/196.6 |
| 3,772,168 | 11/1973 | Dillenberg | 204/43 S |
| 3,887,444 | 6/1975 | Fueki et al. | 204/43 S |
| 3,940,319 | 2/1976 | Pollack | 204/43 S |
| 4,029,556 | 6/1977 | Monaco et al. | 204/40 |
| 4,033,835 | 7/1977 | Lerner et al. | 204/43 S |
| 4,049,508 | 9/1977 | Morrissey | 204/43 S |
| 4,226,082 | 10/1980 | Nishida | 368/285 |
| 4,252,862 | 2/1981 | Nishida | 428/457 |
| 4,418,125 | 11/1983 | Hendricks | 428/639 |
| 4,533,605 | 8/1985 | Hoffman | 428/635 |
| 4,556,607 | 12/1985 | Sastri | 428/627 |
| 4,591,418 | 5/1986 | Snyder | 204/192 P |
| 4,640,869 | 2/1987 | Loth | 428/469 |
| 4,661,215 | 4/1987 | Diehl | 204/48 |
| 4,699,850 | 10/1987 | Kishi et al. | 428/469 |
| 4,761,346 | 8/1988 | Naik | 428/627 |
| 4,847,445 | 7/1989 | Helderman et al. | 174/68.5 |
| 4,849,303 | 7/1989 | Graham et al. | 428/670 |
| 4,911,798 | 3/1990 | Abys et al. | 204/44 |
| 4,925,394 | 5/1990 | Hayashi et al. | 439/86 |
| 5,024,733 | 6/1991 | Abys et al. | 204/3 |
| 5,102,509 | 4/1992 | Albon et al. | 205/257 |
| 5,178,745 | 1/1993 | Abys et al. | 205/219 |
| 5,209,987 | 5/1993 | Penneck et al. | 428/610 |
| 5,250,105 | 10/1993 | Gomes et al. | 106/1.11 |
| 5,314,608 | 5/1994 | Cabellero | 205/238 |
| 5,413,874 | 5/1995 | Moysan, III et al. | 428/627 |

FOREIGN PATENT DOCUMENTS

| | | |
|---|---|---|
| 2528255 | 2/1976 | Germany. |
| 56-166063 | 12/1981 | Japan. |
| 59-9189 | 1/1984 | Japan. |

OTHER PUBLICATIONS

Atotech, Technical Information (Bulletin) Oct. 30, 1994
Electroplating, Frederick A. Lowenheim —Admitted Prior Art.
Bremer, "Electrodeposition of Alloys", 1963, pp. 315–316 & 332–334.
Lowerheim, "Modern Electroplating", 1942, pp. 279–280.

Primary Examiner—David A. Simmons
Assistant Examiner—Linda L. Gray
Attorney, Agent, or Firm—Myron B. Kapustij; Malcolm L. Sutherland

[57] ABSTRACT

An article is coated with a multilayer coating comprising a nickel layer deposited on the surface of the article, a tin-nickel alloy layer deposited on the nickel layer, and a refractory metal compound, preferably zirconium nitride, deposited on the tin-nickel alloy layer. The coating provides the color of polished brass to the article and also provides abrasion and corrosion protection.

11 Claims, 1 Drawing Sheet

ARTICLE HAVING A DECORATIVE AND PROTECTIVE COATING SIMULATING BRASS

This application is a continuation of application Ser. No. 08/447,330 filed on May 22, 1995, now abandoned.

FIELD OF THE INVENTION

This invention relates to multi-layer decorative and protective coatings for substrates, in particular brass substrates.

BACKGROUND OF THE INVENTION

It is currently the practice with various brass articles such as lamps, trivets, candlesticks, door knobs, door handles, door escutcheons and the like to first buff and polish the surface of the article to a high gloss and to then apply a protective organic coating, such as one comprised of acrylics, urethanes, epoxies, and the like, onto this polished surface. While this system is generally quite satisfactory it has the drawback that the buffing and polishing operation, particularly if the article is of a complex shape, is labor intensive. Also, the known organic coatings are not always as durable as desired, particularly in outdoor applications where the coated articles are exposed to the elements and ultraviolet radiation. It would, therefore, be quite advantageous if brass articles, or indeed other metallic articles, could be provided with a coating which gave the article the appearance of highly polished brass and also provided wear resistance and corrosion protection. The present invention provides such a coating.

SUMMARY OF THE INVENTION

The present invention is directed to a metallic substrate having a multi-layer coating disposed or deposited on its surface. More particularly, it is directed to a metallic substrate, particularly brass, having deposited on its surface multiple superposed metallic layers of certain specific types of metals or metal compounds. The coating is decorative and also provides corrosion and wear resistance. The coating provides the appearance of highly polished brass, i.e. has a brass color tone. Thus, an article surface having the coating thereon simulates a highly polished brass surface.

A first layer deposited directly on the surface of the substrate is comprised of nickel. The first layer may be monolithic or preferably it may consist of two different nickel layers such as a semi-bright nickel layer deposited directly on the surface of the substrate and a bright nickel layer superimposed over the semi-bright nickel layer. Disposed over the nickel layer is a layer comprised of tin-nickel alloy. A top layer comprised of a refractory metal compound, preferably a zirconium compound, titanium compound, hafnium compound or tantalum compound, more preferably a titanium compound or a zirconium compound such as zirconium nitride, is disposed over the tin-nickel alloy layer.

The nickel and tin-nickel alloy layers are applied by electroplating. The refractory metal compound, such as zirconium compound, layer is applied by vapor deposition such as sputter ion deposition.

DESCRIPTION OF THE PREFERRED EMBODIMENT

Figure 1:
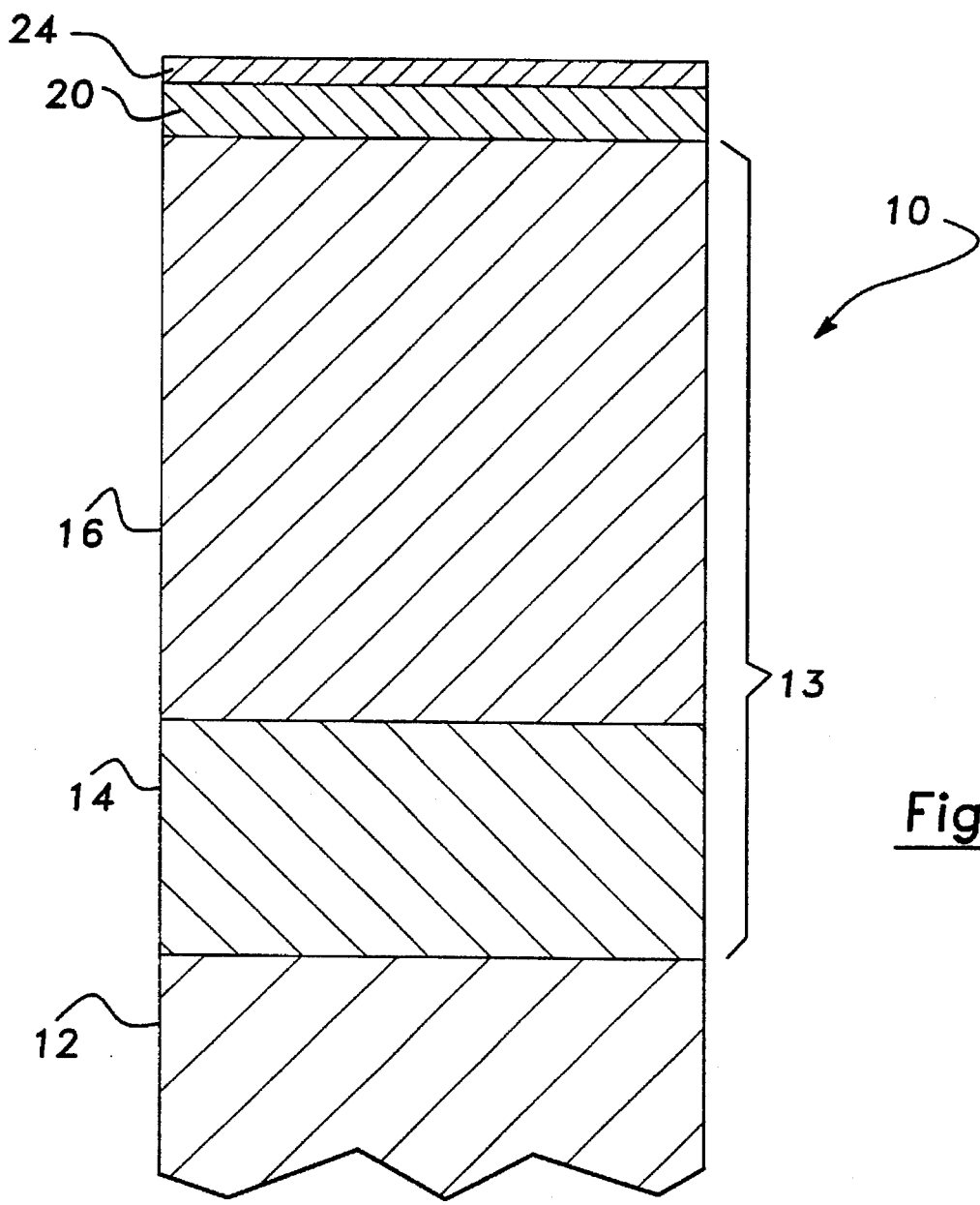
FIG. 1 is a cross-sectional view of a portion of the substrate having the multi-layer coating deposited on its surface.

The substrate 12 can be any platable metal or metallic alloy substrate such as copper, steel, brass, tungsten, nickel alloys, and the like. In a preferred embodiment the substrate is brass.

The nickel layer 13 is deposited on the surface of the substrate 12 by conventional and well known electroplating processes. These processes include using a conventional electroplating bath such as, for example, a Watts bath as the plating solution. Typically such baths contain nickel sulfate, nickel chloride, and boric acid dissolved in water. All chloride, sulfamate and fluoroborate plating solutions can also be used. These baths can optionally include a number of well known and conventionally used compounds such as leveling agents, brighteners, and the like. To produce specularly bright nickel layer at least one brightener from class I and at lease one brightener from class II is added to the plating solution. Class I brighteners are organic compounds which contain sulfur. Class II brighteners are organic compounds which do not contain sulfur. Class II brighteners can also cause leveling and, when added to the plating bath without the sulfur-containing class I brighteners, result in semi-bright nickel deposits. These class I brighteners include alkyl naphthalene and benzene sulfonic acids, the benzene and naphthalene di- and trisulfonic acids, benzene and naphthalene sulfonamides, and sulfonamides such as saccharin, vinyl and allyl sulfonamides and sulfonic acids. The class II brighteners generally are unsaturated organic materials such as, for example, acetylenic or ethylenic alcohols, ethoxylated and propoxylated acetylenic alcohols, coumarins, and aldehydes. These Class I and Class II brighteners are well known to those skilled in the art and are readily commercially available. They are described, inter alia, in U.S. Pat. No. 4,421,611 incorporated herein by reference.

The nickel layer can be comprised of semi-bright nickel, bright nickel, or be a duplex layer containing a layer comprised of semi-bright nickel and a layer comprised of bright nickel. The thickness of the nickel layer is generally in the range of from at least about 50 millionths (0.00005) of an inch, preferably at least about 200 millionths (0.00002) of an inch to about 3,500 millionths (0.0035) of an inch.

As is well known in the art before the nickel layer is deposited on the substrate the substrate is subjected to acid activation by being placed in a conventional and well know acid bath.

In a preferred embodiment as illustrated in the FIGURE, the nickel layer 13 is actually comprised of two different nickel layers 14 and 16. Layer 14 is comprised of semi-bright nickel while layer 16 is comprised of bright nickel. This duplex nickel deposit provides improved corrosion protection to the underlying substrate. The semi-bright, sulfur-free plate 14 is deposited, by conventional electroplating processes directly on the surface of substrate 12. The substrate 12 containing the semi-bright nickel layer 14 is then placed in a bright nickel plating bath and the bright nickel layer 16 is deposited on the semi-bright nickel layer 14.

The thickness of the semi-bright nickel layer and the bright nickel layer is a thickness effective to provide improved corrosion protection. Generally, the thickness of the semi-bright nickel layer is at least about 50 millionths (0.00005) of an inch, and more preferably at least about 150 millionths (0.00015) of an inch. The upper thickness limit is generally not critical and is governed by the secondary considerations such as cost. Generally, however, a thickness of about 1,500 millionths (0.0015) of an inch, preferably about 1,000 millionths (0.001) of an inch, and more preferably about 750 millionths (0.00075) of an inch should not be exceeded. The bright nickel layer 16 generally has a thickness of at least about 50 millionths (0.00005) of an inch, preferably at least about 125 millionths (0.000125) of an inch, and more preferably at least about 250 millionths (0.00025) of an inch. The upper thickness range of the bright nickel layer is not critical and is generally controlled by considerations such as cost. Generally, however, a thickness of about 2,500 millionths (0.0025) of an inch, preferably about 2,000 millionths (0.002) of an inch, and more preferably about 1,500 millionths (0.0015) of an inch should not be exceeded.

The bright nickel layer 16 also functions as a leveling layer which tends to cover or fill in imperfections in the substrate.

Disposed on the bright nickel layer 16 is a layer 20 comprised of tin-nickel alloy. More specifically, layer 20 is comprised of an alloy of tin and nickel. Layer 20 is deposited on layer 16 by conventional tin-nickel electroplating processes. These processes and plating baths are described, inter alia, in U.S. Pat. Nos. 4,033,835; 4,049,508; 3,887,444; 3,772,168 and 3,940,319, all of which are incorporated herein by reference.

The tin-nickel alloy layer is preferably comprised of about 60–70 weight percent tin and about 30–40 weight percent nickel, more preferably about 65% tin and 35% nickel representing the atomic composition SnNi. The plating bath contains sufficient amounts of nickel and tin to provide a tin-nickel alloy of the afore-described composition.

A commercially available tin-nickel plating process is the Ni-Colloy™ process available from ATOTECH, and described in their Technical Information Sheet No: NiColloy, Oct. 30, 1994, incorporated herein by reference.

The thickness of the tin-nickel layer 20 is generally at least about 10 millionths (0.00001) of an inch, preferably at least about 20 millionths (0000.2) of an inch, and more preferably at least about 50 millionths (0.00005) of an inch. The upper thickness range is not critical and is generally dependent on economic considerations. Generally, a thickness of about 2,000 millionths (0.002) of an inch, preferably about 1,000 millionths (0.001), and more preferably about 500 millionths (0.0005) of an inch should not be exceeded.

Layer 24 is comprised of refractory metal compound such as a hafnium compound, a tantalum compound, a titanium compound or a zirconium compound, preferably a titanium compound or a zirconium compound, and more preferably a zirconium compound. The titanium compound is selected from titanium nitride, titanium carbide, and titanium carbonitride, with titanium nitride being preferred. The zirconium compound is selected from zirconium nitride, zirconium carbonitride, and zirconium carbide, with zirconium nitride being preferred.

Layer 24 provides wear and abrasion resistance and the desired color or appearance, such as for example, polished brass. Layer 24 is deposited on layer 20 by any of the well known and conventional deposition processes such as physical vapor deposition, vacuum coating, reactive sputter ion plating, and the like. The preferred method is reactive ion sputter plating.

Reactive ion sputter well known in the art and is generally similar to ion sputter deposition except that a reactive gas which reacts with the dislodged target material is introduced into the chamber. Thus, in the case where zirconium nitride is the top layer 24, the target is comprised of zirconium and nitrogen gas is the reactive gas introduced into the chamber. By controlling the amount of nitrogen available to react with the zirconium, the color of the zirconium nitride can be made to be similar to that of brass of various hues.

Ion sputtering techniques and equipment are well known in the art and are disclosed, inter alia, in T. Van Vorous, "Planar Magnetron Sputtering: A New Industrial Coating Technique", Solid State Technology, December 1976, pp 62–66; U. Kapacz and S. Schulz, "Industrial Application of Decorative Coatings—Principle and Advantages of the Sputter Ion Plating Process", Soc. Vac. Coat., Proc. 34th Arn. Techn. Conf., Philadelphia, U.S.A., 1991, 48–61; and U.S. Pat. Nos. 4,162,954, and 4,591,418, all of which are incorporated herein by reference.

Briefly, in the sputter ion deposition process the metal such as titanium or zirconium target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

Layer 24 has a thickness at least effective to provide abrasion resistance. Generally, this thickness is at least 2 millionths (0.000002) of an inch, preferably at least 4 millionths (0.000004) of an inch, and more preferably at least 6 millionths (0.000006) of an inch. The upper thickness range is generally not critical and is dependent upon considerations such as cost. Generally a thickness of about 30 millionths (0.00003) of an inch, preferably about 25 millionths (0.000025) of an inch, and more preferably about 20 millionths (0.000020) of an inch should not be exceeded.

Zirconium nitride is the preferred coating material as it most closely provides the appearance of polished brass.

In order that the invention may be more readily understood the following example is provided. The example is illustrative and does not limit the invention thereto.

EXAMPLE 1

Brass door escutcheons are placed in a conventional soak cleaner bath containing the standard and well known soaps, detergents, defloculants and the like which is maintained at a pH of 8.9–9.2 and a temperature of 180°–200° F. for 30 minutes. The brass escutcheons are then placed for six minutes in a conventional ultrasonic alkaline cleaner bath. The ultrasonic cleaner bath has a pH of 8.9–9.2, is maintained at a temperature of about 160°–180° F., and contains the conventional and well known soaps, detergents, defloculants and the like. After the ultrasonic cleaning the escutcheons are rinsed and placed in a conventional alkaline electro cleaner bath for about two minutes. The electro cleaner bath contains an insoluble submerged steel anode, is maintained at a temperature of about 140°–180° F., a pH of about 10.5–11.5, and contains standard and conventional detergents. The escutcheons are then rinsed twice and placed in a conventional acid activator bath for about one minute. The acid activator bath has a pH of about 2.0–3.0, is at an ambient temperature, and contains a sodium fluoride based acid salt. The escutcheons are then rinsed twice and placed in a semi-bright nickel plating bath for about 10 minutes. The semi-bright nickel bath is a conventional and well known bath which has a pH of about 4.2–4.6, is maintained at a temperature of about 130°–150° F., contains $NiSO_4$, $NiCL_2$, boric acid, and brighteners. A semi-bright nickel layer of an average thickness of about 250 millionths of an inch (0.00025) is deposited on the surface of the escutcheon.

The escutcheons containing the layer of semi-bright nickel are then rinsed twice and placed in a bright nickel plating bath for about 24 minutes. The bright nickel bath is generally a conventional bath which is maintained at a temperature of about 130°–150° F., a pH of about 4.0–4.8, contains $NiSO_4$, $NiCL_2$, boric acid, and brighteners. A bright nickel layer of an average thickness of about 750 millionths (0.00075) of an inch is deposited on the semi-bright nickel layer.

The bright nickel plated escutcheons are rinsed twice and placed in a tin-nickel plating bath for about 7½ minutes. The bath is maintained at a temperature of about 120°–140° F. and a pH of about 4.5–5.0. The bath contains stannous chloride, nickel chloride, ammonium bifluoride, and other well known and conventional complexing and wetting agents. A tin-nickel layer of an average thickness of about 200 millionths of an inch (0.0002) is deposited on the surface of the bright nickel layer.

The tin-nickel alloy plated escutcheons are placed in a sputter ion plating vessel. This vessel is a stainless steel vacuum vessel marketed by Leybold A. G. of Germany. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, two sources of nitrogen gas are connected to the chamber by an adjustable valve for varying the rate of flow of nitrogen into the chamber.

Two pairs of magnetron-type target assemblies are mounted in a spaced apart relationship in the chamber and connected to negative outputs of variable D.C. power supplies. The targets constitute cathodes and the chamber wall is an anode common to the target cathodes. The target material comprises zirconium.

A substrate carrier which carries the substrates, i.e., escutcheons, is provided, e.g., it may be suspended from the top of the chamber, and is rotated by a variable speed motor to carry the substrates between each pair of magnetron target assemblies. The carrier is conductive and is electrically connected to the negative output of a variable D.C. power supply.

The plated escutcheons are mounted onto the substrate carrier in the sputter ion plating vessel. The vacuum chamber is evacuated to a pressure of about $5\times10^{-3}$ millibar and is heated to about 400° C. via a radiative electric resistance heater. The target material is sputter cleaned to remove contaminants from its surface. Sputter cleaning is carried out for about one half minute by applying power to the cathodes sufficient to achieve a current flow of about 18 amps and introducing argon gas at the rate of about 200 standard cubic centimeters per minute. A pressure of about $3\times10^{-3}$ millibars is maintained during sputter cleaning.

The escutcheons are then cleaned by a low pressure etch process. The low pressure etch process is carried on for about five minutes and involves applying a negative D.C. potential which increases over a one minute period from about 1200 to about 1400 volts to the escutcheons and applying D.C. power to the cathodes to achieve a current flow of about 3.6 amps. Argon gas is introduced at a rate which increases over a one minute period from about 800 to about 1000 standard cubic centimeters per minute, and the pressure is maintained at about $1.1\times10^{-2}$ millibars. The escutcheons are rotated between the magnetron target assemblies at a rate of one revolution per minute. The escutcheons are then subjected to a high pressure etch cleaning process for about 15 minutes. In the high pressure etch process argon gas is introduced into the vacuum chamber at a rate which increases over a 10 minute period from about 500 to 650 standard cubic centimeters per minute (i.e., at the beginning the flow rate is 500 sccm and after ten minutes the flow rate is 650 sccm and remains 650 sccm during the remainder of the high pressure etch process), the pressure is maintained at about $2\times10^{-1}$ millibars, and a negative potential which increases over a ten minute period from about 1400 to 2000 volts is applied to the escutcheons. The escutcheons are rotated between the magnetron target assemblies at about one revolution per minute. The pressure in the vessel is maintained at about $2\times10^{-1}$ millibar.

The escutcheons are then subjected to another low pressure etch cleaning process for about five minutes. During this low pressure etch cleaning process a negative potential of about 1400 volts is applied to the escutcheons, D.C. power is applied to the cathodes to achieve a current flow of about 2.6 amps, and argon gas is introduced into the vacuum chamber at a rate which increases over a five minute period from about 800 sccm (standard cubic centimeters per minute) to about 1000 sccm. The pressure is maintained at about $1.1\times10^{-2}$ millibar and the escutcheons are rotated at about one rpm.

The target material is again sputter cleaned for about one minute by applying power to the cathodes sufficient to achieve a current flow of about 18 amps, introducing argon gas at a rate of about 150 sccm, and maintaining a pressure of about $3\times10^{-3}$ millibars.

During the cleaning process shields are interposed between the escutcheons and the magnetron target assemblies to prevent deposition of the target material onto the escutcheons.

The shields are removed and a zirconium nitride layer having an average thickness of about 14 millionths (0.000014) of an inch is deposited on the tin-nickel layer by reactive ion sputtering over a 14 minute period. A negative potential of about 200 volts D.C. is applied to the escutcheons while D.C. power is applied to the cathodes to achieve a current flow of about 18 amps. Argon gas is introduced at a flow rate of about 500 sccm. Nitrogen gas is introduced into the vessel from two sources. One source introduces nitrogen at a generally steady flow rate of about 40 sccm. The other source is variable. The variable source is regulated so as to maintain a partial ion current of $6.3\times10^{-11}$ amps, with the variable flow of nitrogen being increased or decreased as necessary to maintain the partial ion current at this predetermined value.

The pressure in the vessel is maintained at about $7.5\times10^{-3}$ millibar.

The zirconium-nitride coated escutcheons are then subjected to low pressure cool down, where the heating is discontinued, pressure is increased from about $1.1\times10^{-2}$ millibar to about $2\times10^{-1}$ millibar, and argon gas is introduced at a rate of 950 sccm.

While certain embodiments of the invention have been described for purposes of illustration, it is to be understood that there my be various embodiments and modifications within the general scope of the invention which are not described in these embodiments.

What is claimed is:

1. An article comprising a metallic substrate having disposed on at least a portion of its surface a multi-layer coating simulating brass comprising:

layer comprised of semi-bright nickel;
   layer comprised of bright nickel;
   layer comprised of tin-nickel; and
   a top layer comprised of zirconium compound or titanium compound.

2. The article of claim 1 wherein said layer comprised of zirconium compound or titanium compound is comprised of zirconium compound.

3. The article of claim 2 wherein said zirconium compound is comprised of zirconium nitride.

4. The article of claim 1 wherein said layer comprised of zirconium compound or titanium compound is comprised of zirconium nitride or titanium nitride.

5. The article of claim 1 wherein said metallic substrate is comprised of brass.

6. The article of claim 3 wherein said metallic substrate is comprised of brass.

7. An article comprising a substrate having on at least a portion of its surface a multi-layered coating having a brass color comprising a first layer comprised of semi-bright nickel;

a second layer on at least a portion of said first layer comprised of bright nickel;

a third layer on at least a portion of said second layer comprised of tin-nickel alloy; and a top layer on at least a portion of said third layer comprised of a zirconium compound or titanium compound.

8. The article of claim 7 wherein said top layer is comprised of a zirconium compound.

9. The article of claim 8 wherein said zirconium compound is zirconium nitride.

10. The article of claim 9 wherein said substrate is comprised of brass.

11. The article of claim 7 wherein said substrate is comprised of brass.

* * * * *